(12) United States Patent
Choi

(10) Patent No.: US 10,743,429 B2
(45) Date of Patent: Aug. 11, 2020

(54) ROLLABLE DISPLAY DEVICE

(71) Applicant: LG Display Co., Ltd., Seoul (KR)

(72) Inventor: Chang-Hee Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/575,901

(22) Filed: Sep. 19, 2019

(65) Prior Publication Data

US 2020/0100371 A1 Mar. 26, 2020

(30) Foreign Application Priority Data

Sep. 21, 2018 (KR) ........................ 10-2018-0113874

(51) Int. Cl.
| | |
|---|---|
| *H05K 5/00* | (2006.01) |
| *H05K 5/03* | (2006.01) |
| *H05K 1/14* | (2006.01) |
| *H01L 27/32* | (2006.01) |
| *H01L 51/52* | (2006.01) |

(52) U.S. Cl.
CPC .......... *H05K 5/0017* (2013.01); *H05K 1/147* (2013.01); *H05K 5/03* (2013.01); *H01L 27/3244* (2013.01); *H01L 51/524* (2013.01); *H01L 2251/5338* (2013.01); *H05K 2201/10128* (2013.01)

(58) Field of Classification Search
CPC ........ H05K 5/0017; H05K 5/03; H05K 1/147; H05K 2201/10128; H01L 2251/5338; H01L 27/3244; H01L 51/524; G09F 9/301; G02F 1/1333; G02F 1/133305; G02F 1/133308; G06F 1/163; G06F 1/1652; G06F 1/1626; A44C 5/0053; A45D 2/127
See application file for complete search history.

(56) References Cited

U.S. PATENT DOCUMENTS

| | | | |
|---|---|---|---|
| 7,347,019 B1 * | 3/2008 | Shaw ...................... | F16F 1/025 |
| | | | 40/607.01 |
| 9,668,550 B2 * | 6/2017 | Seo ........................ | A44C 5/0076 |
| 9,874,260 B2 * | 1/2018 | Blochlinger ............ | F16F 1/027 |
| 10,146,261 B2 * | 12/2018 | Hashimoto ............ | G06F 3/016 |
| 10,263,216 B2 | 4/2019 | Koo et al. | |
| 10,318,129 B2 * | 6/2019 | Inagaki ................. | G06F 1/1626 |
| 2007/0241002 A1 * | 10/2007 | Wu ........................ | G06F 1/1601 |
| | | | 206/150 |

(Continued)

FOREIGN PATENT DOCUMENTS

| | | |
|---|---|---|
| KR | 10-2017-0136060 A | 12/2017 |
| KR | 10-2017-0139733 A | 12/2017 |
| KR | 10-2018-0051701 A | 5/2018 |

*Primary Examiner* — Abhishek M Rathod
(74) *Attorney, Agent, or Firm* — Morgan, Lewis & Bockius LLP

(57) ABSTRACT

The present invention relates to a rollable display device. A rollable display device includes a display module including a flexible display panel; and a support unit disposed at a rear surface of the display module and including a bar-shaped rigid plate and a cover configured to fix the rigid plate to the rear surface of the display module, wherein the bar-shaped rigid plate has a first hardness, and wherein the bar-shaped rigid plate is in close contact with and fixed to the cover having a second hardness lower than the first hardness, so that the bar-shaped rigid plate is free from the display module. The rollable display device may have improved rigidity in an unrolled state.

18 Claims, 8 Drawing Sheets

(56) References Cited

U.S. PATENT DOCUMENTS

| | | | |
|---|---|---|---|
| 2009/0251888 A1* | 10/2009 | Douglas | G09F 3/005 |
| | | | 362/103 |
| 2013/0265631 A1* | 10/2013 | Ahn | G09F 9/372 |
| | | | 359/295 |
| 2013/0329162 A1* | 12/2013 | Fujii | H05K 7/14 |
| | | | 349/58 |
| 2014/0000984 A1* | 1/2014 | Thornton | A47G 9/062 |
| | | | 185/37 |
| 2014/0055924 A1* | 2/2014 | Baek | G02F 1/133308 |
| | | | 361/679.01 |
| 2015/0089974 A1* | 4/2015 | Seo | A44C 5/0076 |
| | | | 63/1.13 |
| 2016/0037625 A1* | 2/2016 | Huitema | H05K 5/0217 |
| | | | 361/749 |
| 2017/0235341 A1* | 8/2017 | Huitema | G06F 1/1652 |
| | | | 361/679.03 |
| 2017/0344073 A1 | 11/2017 | Kang et al. | |
| 2017/0359911 A1 | 12/2017 | Hayk et al. | |

\* cited by examiner

ROLLABLE DISPLAY DEVICE

CROSS-REFERENCE TO RELATED APPLICATION

The present application claims priority from and the benefit under 35 U.S.C § 119(a) of Korean Patent Application No. 10-2018-0113874 filed in the Republic of Korea on Sep. 21, 2018, which is hereby incorporated by reference in its entirety.

BACKGROUND

Technical Field

The present disclosure relates to a rollable display device, and more particularly, a rollable display device having improved rigidity in an unrolled state.

Discussion of the Related Art

Recently, with entering into a full-fledged information age, there is a growing interest in information display dealing with and displaying mass information. In response to this, various flat panel display devices have been developed and have been in the spotlight.

Specific examples of the flat panel display devices include liquid crystal display (LCD) devices, plasma display panel (PDP) devices, field emission display (FED) devices, electroluminescence display (ELD) devices, organic light emitting diode display (OLED) devices. The flat panel display devices show excellent performance of thin thickness, light weight, and low power consumption and have rapidly replaced cathode ray tube (CRT).

However, since the flat panel display devices use a glass substrate, there is a limit in providing light weight, thin thickness and flexibility.

Accordingly, a flexible display device is emerging as a next-generation display device, which is manufactured to maintain display performance even if it is bent like a paper using a flexible material such as plastic instead of a glass substrate without flexibility.

The flexible display device uses a plastic thin film transistor substrate, which is not glass. The flexible display device may be classified into an unbreakable display device having high durability, a bendable display device capable of being bent without break, a rollable display device capable of being rolled, and a foldable display device capable of being folded. The flexible display device may have advantages of space utilization, interior and design and may have various applications.

In particular, a rollable display device has been actively researched so as to realize the large area and portability as well as ultrathin thickness, light weight and small size.

SUMMARY

Accordingly, embodiments of the present disclosure are directed to a rollable display device that substantially obviates one or more of the problems due to limitations and disadvantages of the related art.

An aspect of the present disclosure is to provide a rollable display device that easily performs rolling and unrolling operations of a display panel.

Another aspect of the present disclosure is to support a display panel in an unrolled state and stably fix the display panel in a rolled state.

Another aspect of the present disclosure is to prevent sliding between components of a rollable display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a rollable display device comprises a display module including a flexible display panel; and a support unit disposed at a rear surface of the display module and including a bar-shaped rigid plate and a cover configured to fix the rigid plate to the rear surface of the display module, wherein the bar-shaped rigid plate has a first hardness, and wherein the bar-shaped rigid plate is in close contact with and fixed to the cover having a second hardness lower than the first hardness, so that the bar-shaped rigid plate is free from the display module.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate embodiments of the disclosure and together with the description serve to explain various principles of the present disclosure. In the drawings.

DETAILED DESCRIPTION

Reference will now be made in detail to embodiments of the disclosure, examples of which are illustrated in the accompanying drawings.

Figure 1:
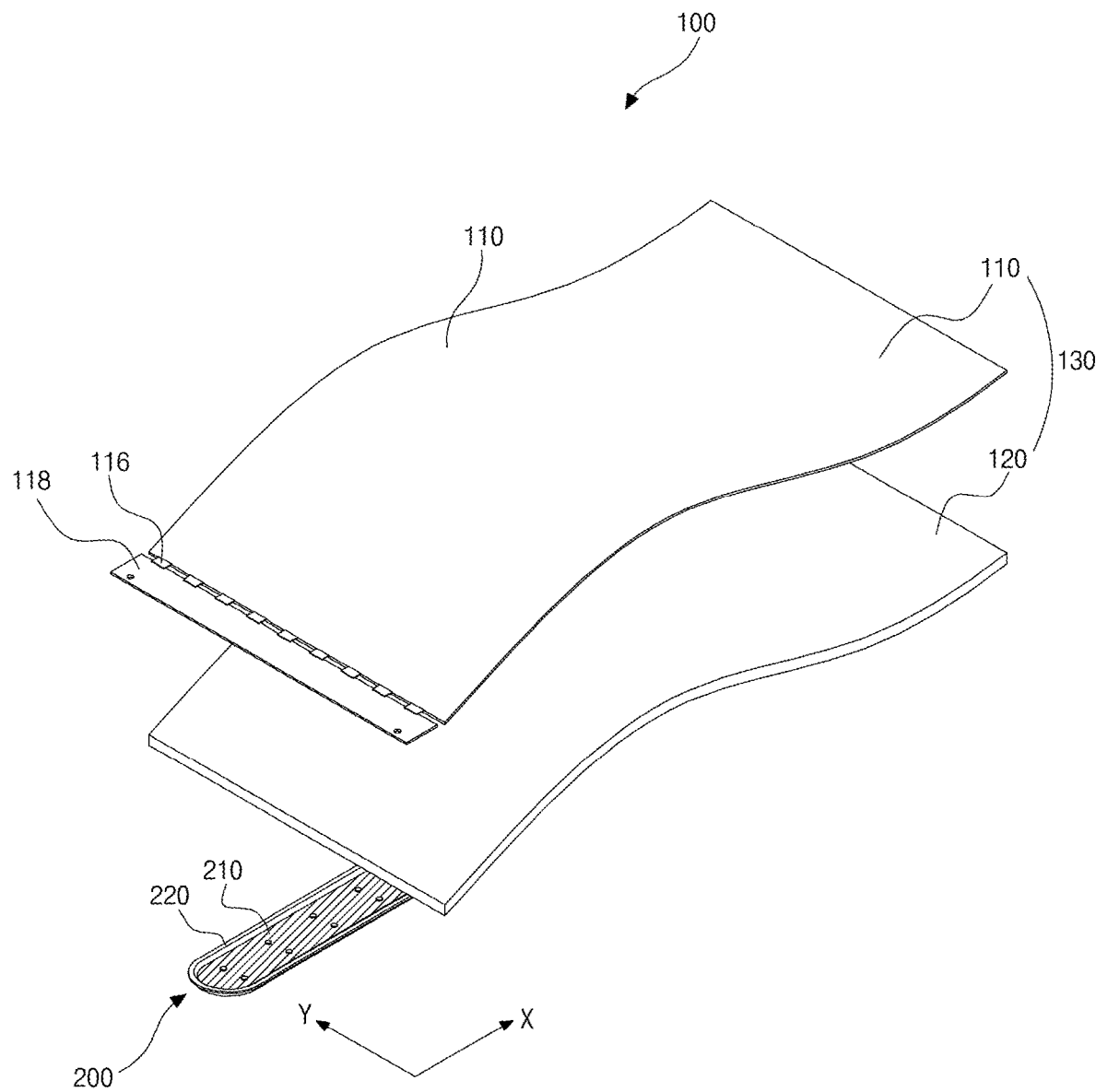
FIG. 1 is an exploded perspective view schematically illustrating a rollable display device according to an embodiment of the present disclosure.
Figure 2A:
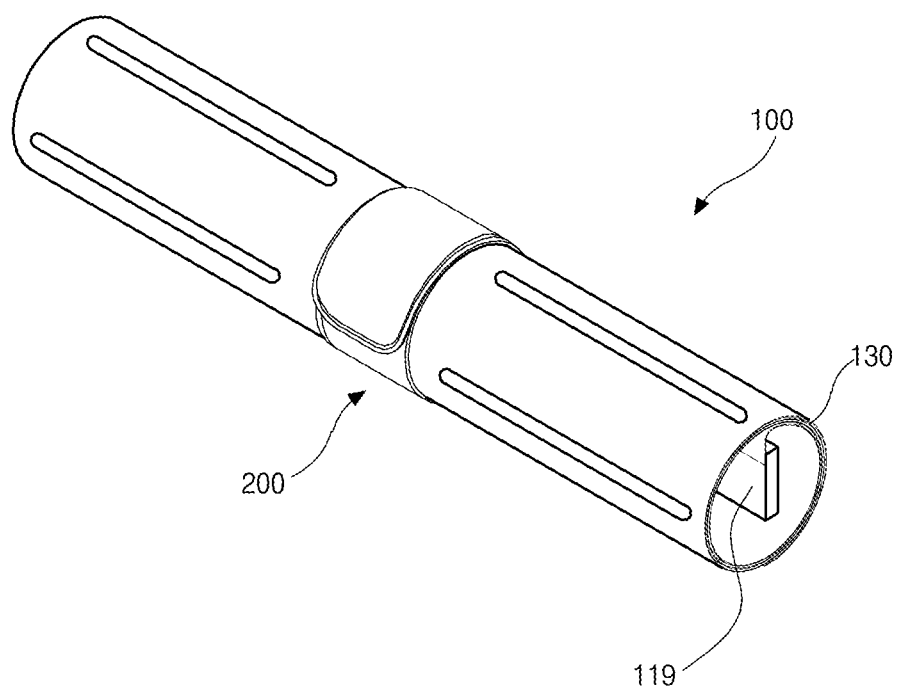
FIGS. 2A to 2D are perspective views schematically illustrating the rollable display device according to the embodiment of the present disclosure.
Figure 2B:
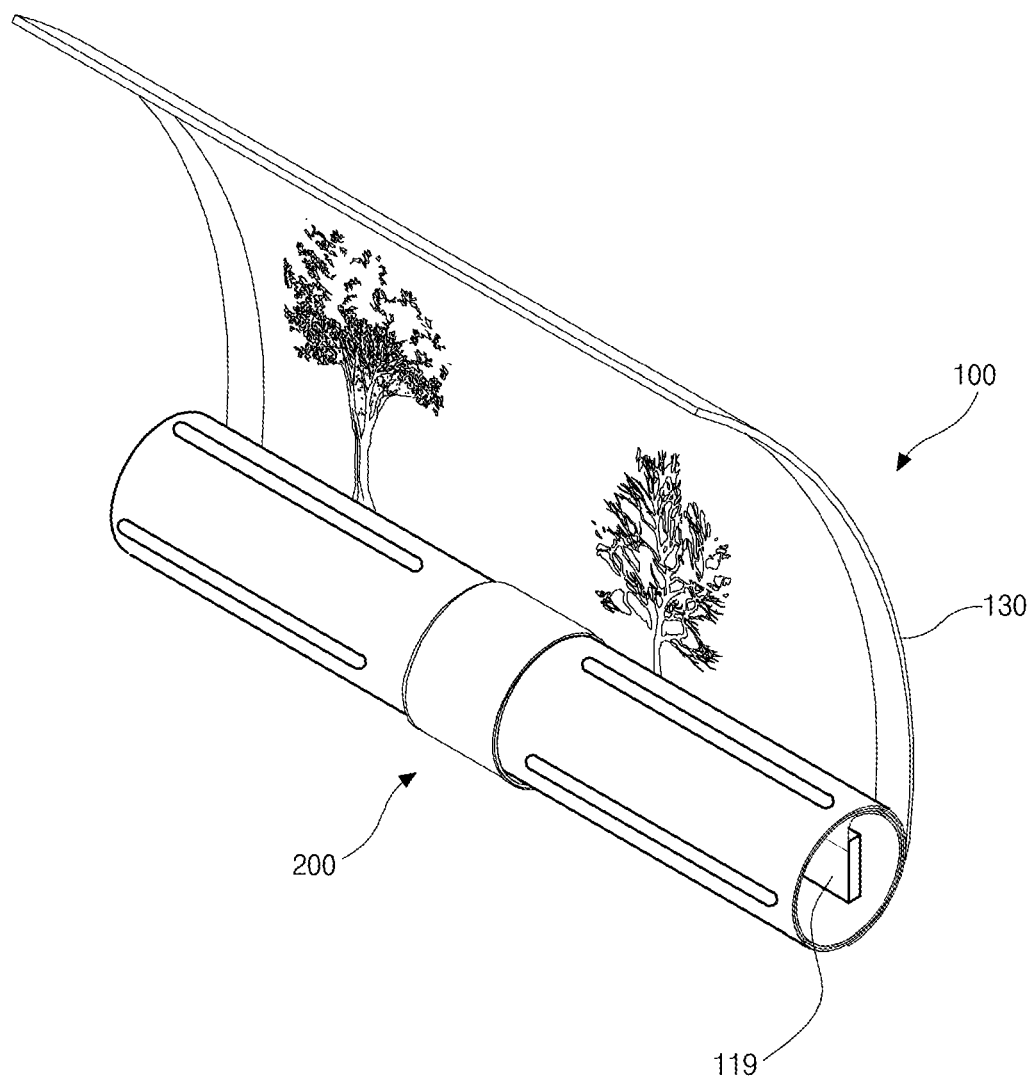
Figure 2C:
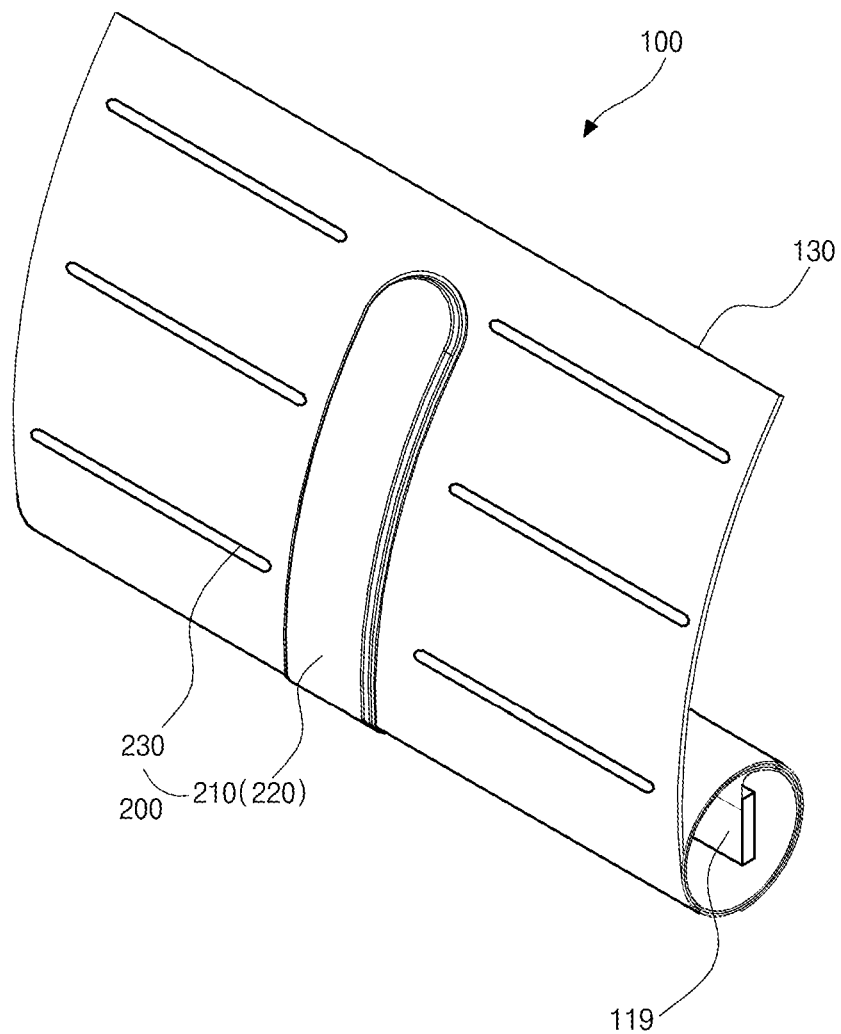
Figure 2D:
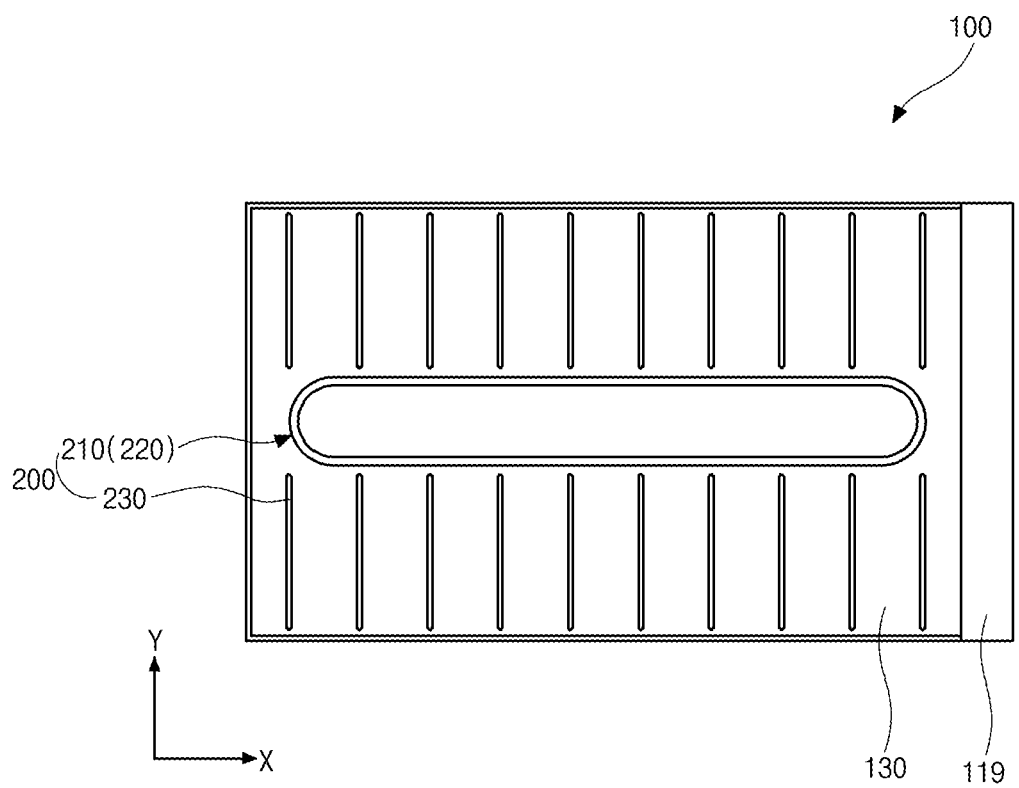

FIG. 1 is an exploded perspective view schematically illustrating a rollable display device according to an embodiment of the present disclosure. FIGS. 2A to 2D are perspective views schematically illustrating the rollable display device according to the embodiment of the present disclosure. FIG. 2A is a perspective view showing the rollable display device when it is rolled, FIG. 2B is a front perspective view showing a front surface of the rollable display device on which an image is implemented, FIG. 2C is a rear perspective view showing a rear surface of the rollable display device of FIG. 2B, and FIG. 2D is a rear perspective view schematically showing a rear surface of the rollable display device when it is fully unrolled.

In FIG. 1, the rollable display device 100 includes a display panel 110 for implementing an image, a back cover 120 for supporting the display panel 110 from the rear, and a support unit 200 for supporting and fixing rolled and unrolled states of the rollable display device 100.

Here, the display panel 110 may be one of a liquid crystal display device (LCD), a plasma display panel device (PDP), a field emission display device (FED), an electroluminescence display device (ELD) and an organic light emitting diode display (OLED). The OLED, which is a representative of a flexible display device capable of maintaining display performance even if bent like paper, is preferably used.

The OLED can be lightweight and thin because the OLED is a self-luminous element and does not require a backlight unit used in a liquid crystal display device which is a non-luminous element.

The OLED also has wide viewing angles and high contrast ratio as compared with a liquid crystal display device and has advantages in power consumption. In addition, the OLED is driven by low voltages of direct current (DC) and has a fast response time. Further, the OLED is strong against the external impacts and is used in a wide range of temperatures because its components are solids.

Particularly, since the manufacturing processes of the OLED are simple, it is advantageous in that the production cost can be saved more than a liquid crystal display device.

The display panel 110 made of an OLED includes a driving thin film transistor and a light emitting diode on a substrate which can be bent or curved, and the substrate is encapsulated by a protective film.

More specifically, although not shown in the figure, the driving thin film transistor is formed for each pixel region on the substrate which is bendable or flexible, and a first electrode connected to each driving thin film transistor, an organic light emitting layer on the first electrode, and a second electrode on the organic light emitting layer are formed.

The organic light emitting layer emits white light or red, green and blue light for each pixel region.

The first and second electrodes and the organic light emitting layer therebetween form the light emitting diode. In the display panel 110 having such a structure, the first electrode functions as an anode, and the second electrode serves as a cathode.

Here, the substrate may be formed of a flexible material that can be bent or curved. For example, the substrate may be formed of polyimide (PI), polyethylene terephthalate (PET), polyethylene naphthalate (PEN), polycarbonate (PC), polyethersulfone (PES), polyacrylate (PAR), polysulfone (PSF), or cyclic-olefin copolymer (COC).

Meanwhile, the number of pixel regions increases due to a large size and high resolution of the display panel 110, so that a sufficient amount of common voltage and driving voltage are required.

For stable power supply, a common voltage portion or a driving voltage portion is mounted on a printed circuit board 118 provided separately from a driving unit, and the printed circuit board 118 is connected to the display panel 110 along one edge of the substrate of the display panel 110 through a connection member 116 such as a bar-shaped flexible circuit board or a tape carrier package (TCP).

Referring to FIG. 2A, the printed circuit board 118 is disposed inside the display panel 110 when the display panel is rolled. Namely, the printed circuit board 118 is folded inward the rolled display panel 110 when the display panel 110 is rolled. The printed circuit board 118 on which the driving unit is mounted is positioned inside a case 119 and is protected by the case 119 to thereby prevent the impact from being externally applied to the printed circuit board 118 when the display panel 110 is rolled or unrolled.

In addition, since the printed circuit board 118 is positioned inside the rolled display panel 110, the space utilization can be further improved, and the printed circuit board 118 cannot be recognized from the outside, thereby giving a neat aesthetic impression.

Here, the case 119 is illustrated as having the same bar shape as the printed circuit board 118 such that the printed circuit board 118 is mounted inside the case 119. Alternatively, the case 119 may have any shape surrounding the outside of the printed circuit board 118.

In the display panel 110, since the substrate is a material that can be bent or curved, the back cover 120 is disposed at a rear surface of the display panel 110 opposite to the front surface on which the image is implemented, thereby increasing rigidity.

The rollable display device 100 according to the embodiment of the present disclosure can improve the physical durability of the display device 100 by providing the back cover 120.

The back cover 120 may have a plate shape covering the rear surface of the display panel 110 and may include a material having light weight and high rigidity. For example, the back cover 120 may be formed of at least one of glass fiber reinforced plastics (GFRP), carbon fiber reinforced plastics (CFRP), metal such as aluminum, and plastic. However, the present disclosure is not limited thereto.

The size and shape of the back cover 120 can be appropriately selected within a range that does not restrict and limit free deformation of the display panel 110.

Further, the back cover 120 may be formed of at least one of aluminum (Al), copper (Cu), zinc (Zn), silver (Ag), gold (Au), iron (Fe) and their alloy having relatively high thermal conductivity such that heat emitted from the display device 100 can be rapidly dissipated to the outside. The back cover 120 may be formed of aluminum (Al) or electrolytic galvanized iron (EGI) having relatively high thermal conductivity, low weight and low cost characteristics.

The back cover 120 may function to block moisture and oxygen that may be introduced from the outside through the substrate of the display panel 110.

At this time, although not shown in the figure, the back cover 120 may include a plurality of opening patterns such that the display panel 110 can be more easily rolled. The plurality of opening patterns each may have a shape extending along a direction perpendicular to a rolling direction in which the display panel 110 is rolled, more particularly, along a Y-axis direction defined in the figure.

The plurality of opening patterns extending along the Y-axis direction may be spaced apart from each other by a predetermined distance across the Y-axis direction of the back cover 120. Otherwise, the plurality of openings may be divided into a plurality of rows along the Y-axis direction, and the openings of adjacent rows may be alternated and spaced apart from each other.

The back cover 120 is attached to the display panel 110 through an optical adhesive layer such as optical clear adhesive or optically clear adhesive (OCA).

Hereinafter, the back cover 120 attached to the rear surface of the display panel 110 will be omitted for convenience of explanation. For example, the display panel 110 and the back cover 120, which are integrated as one body, are defined as a display module 130.

The support unit 200 is disposed at the rear surface of the back cover 120. The display module 130 according to the embodiment of the present disclosure is supported by the support unit 200 so as to stably maintain the rolled state or the unrolled state.

Namely, the support unit 200 includes a bar-shaped rigid plate 210, a cover 220 covering and protecting the outside of the rigid plate 210, and a plurality of stiffeners 230. The bar-shaped rigid plate 210 is disposed across a center portion of the back cover 120 along the rolling direction in which the display module 130 is rolled, more precisely, along an X-axis direction defined in the figure.

Accordingly, as shown in FIGS. 2A to 2D, the rollable display device 100 according to the embodiment of the present disclosure displays an image while an end of the display module 130 is unrolled as shown in FIGS. 2B to 2D according to the need of the user from the rolled state where the display module 130, which includes the display panel 110 capable of implementing an image and the back cover 120 attached to each other, is rolled up as shown in FIG. 2A.

Here, in FIGS. 2A to 2D, the display module 130 is illustrated as being rolled such that the front surface of the display panel 110 displaying the image is an inner surface of the rolled display module 130. This may be referred to as outer rolling. On the other hand, the display module 130 may be rolled such that the front surface of the display panel 110 is an outer surface of the rolled display module 130, and this may be referred to as inner rolling.

When the rollable display device 100 is not in use, the display module 130 is rolled up, and when the rollable display device 100 is to be used, the display module 130 is unrolled. Therefore, the display device 100 has an advantage of excellent spatial utilization.

In addition, the rollable display device 100 can easily adjust the aspect ratio to satisfy the desired image ratio and can realize the ultrathin thickness, light weight and portability. Thus, the rollable display device 100 also has advantages of excellent interior and design utilizations.

The rolled and unrolled states of the rollable display device 100 may be controlled by a physical external force directly provided by the user or may be controlled by a control unit in response to a predetermined specific signal.

Particularly, the rollable display device 100 according to the embodiment of the present disclosure further includes the support unit 200 at the rear surface of the display module 130. As shown in FIG. 2A, when the display module 130 is in the rolled state in which the display module is rolled up, the display module 130 is stably maintained by the support unit 200, and as shown in FIGS. 2B to 2D, when the display module 130 is in the unrolled state in which the display module 130 is unrolled, the display module 130 is supported by the support unit 200 to thereby improve rigidity.

In the rolled state, the support unit 200 is wound around the outside of the display module 130 such that the display module 130 stably maintains the rolled state. Then, when the display module 130 is to be unrolled to implement the unrolled state, the support unit 200 is simply unwound together with the display module 130, and the rigidity of the display module 130 in the unrolled state is improved through the simple operation of the support unit 200.

Accordingly, the rollable display device 100 according to the embodiment of the present disclosure can facilitate the rolling and unrolling operation of the display module 130. In addition, the display module 130 can be supported when unrolling, and can be stably fixed when rolling at the same time.

This will be described in more detail with reference to the following drawings.

Figure 3A:
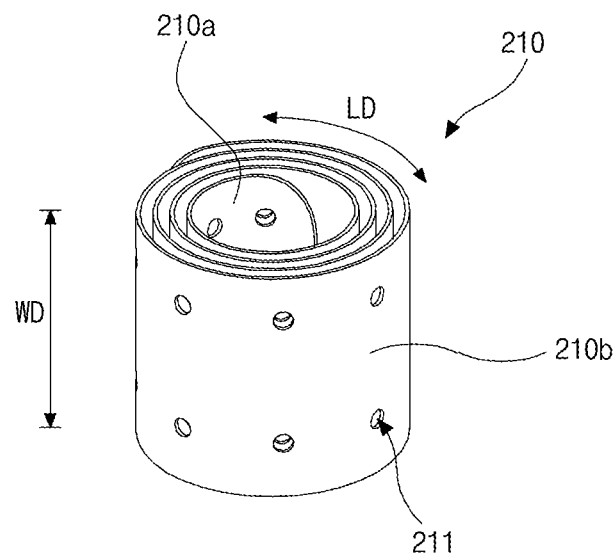
FIGS. 3A and 3B are perspective views for explaining characteristics of a rigid plate of a support unit according to the embodiment of the present disclosure.
Figure 3B:
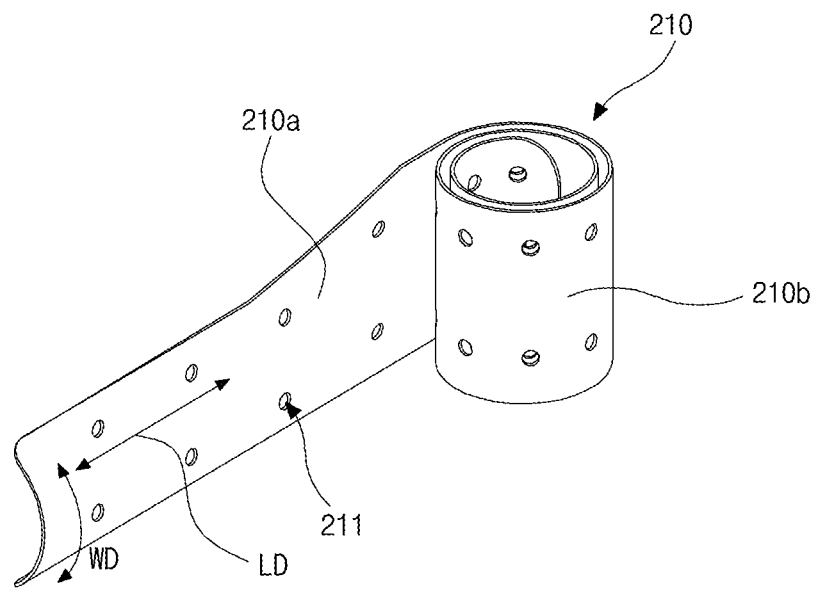

FIGS. 3A and 3B are perspective views for explaining characteristics of a rigid plate of a support unit according to the embodiment of the present disclosure.

Figure 4A:
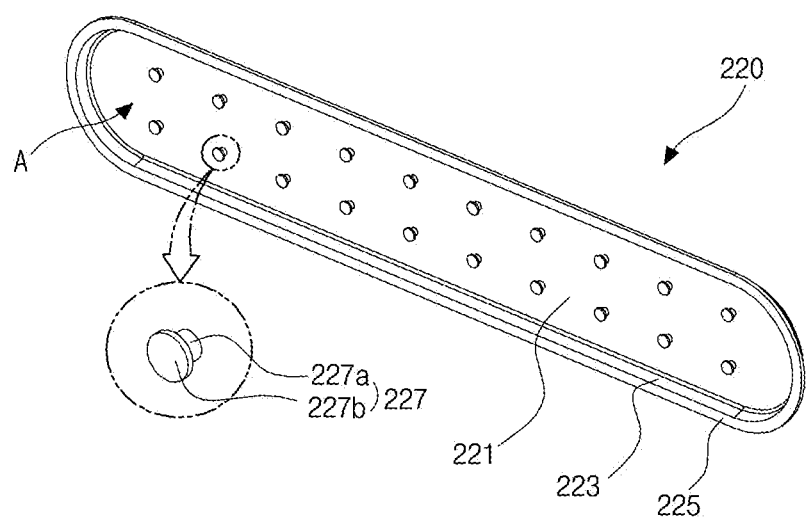
FIG. 4A is a front perspective view schematically illustrating a cover of a support unit according to the embodiment of the present disclosure.
Figure 4B:
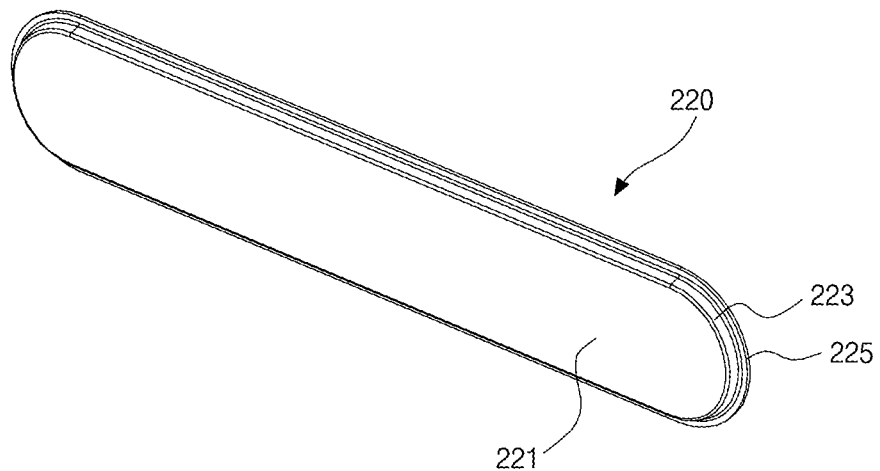
FIG. 4B is a rear perspective view of the cover of the support unit of FIG. 4A.

FIG. 4A is a front perspective view schematically illustrating a cover of a support unit according to the embodiment of the present disclosure, and FIG. 4B is a rear perspective view of the cover of the support unit of FIG. 4A.

Figure 5A:
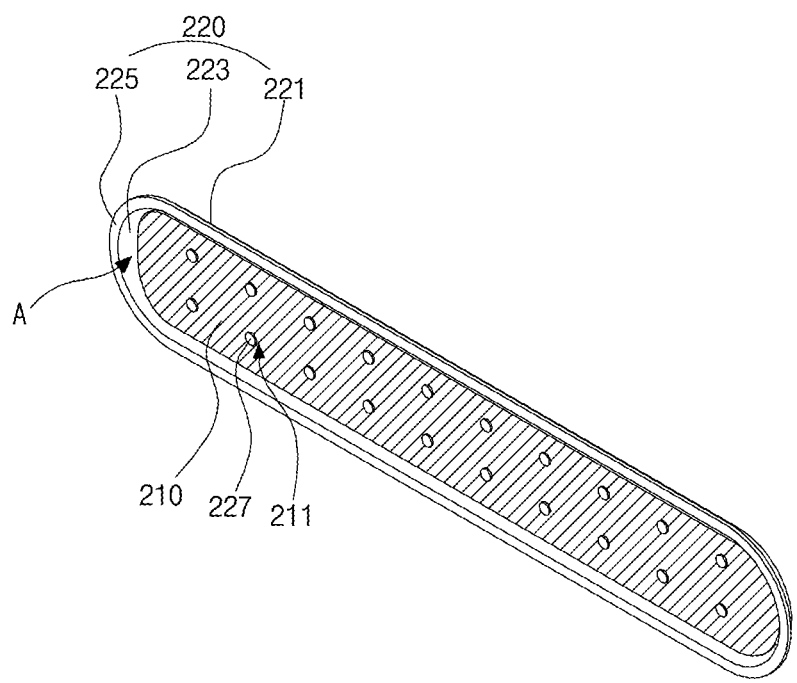
FIG. 5A is a front perspective view schematically illustrating a state in which the rigid plate and cover of the support unit according to the embodiment of the present disclosure are assembled and fastened.
Figure 5B:
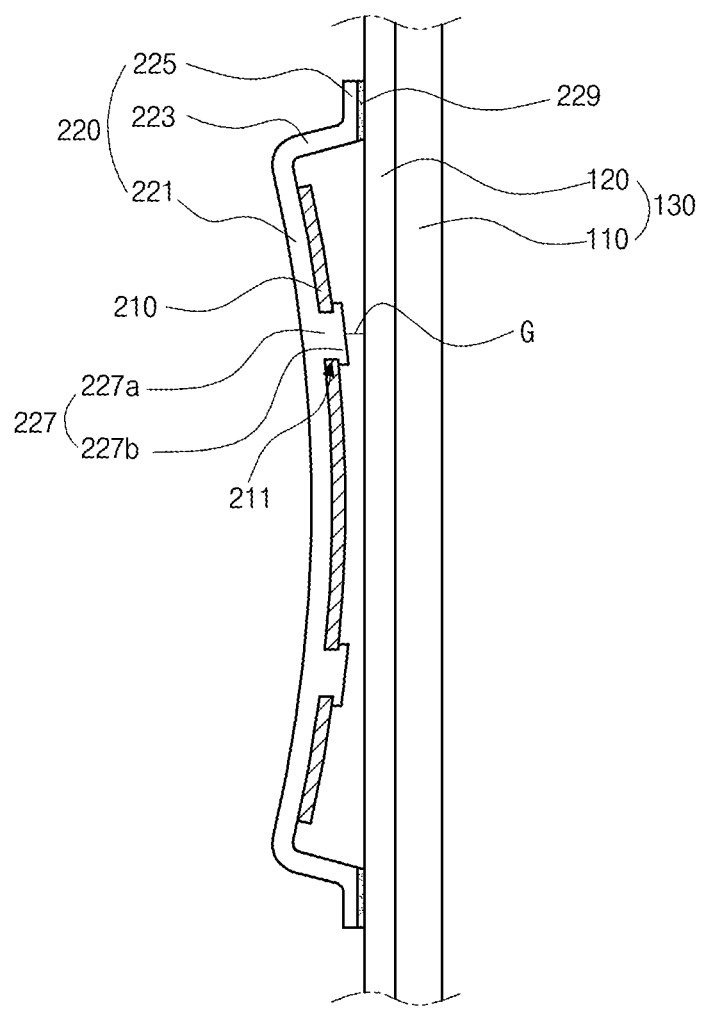
FIG. 5B is a cross-sectional view schematically illustrating a state in which the rigid plate and the cover are attached to and fixed to the display module.

FIG. 5A is a front perspective view schematically illustrating a state in which the rigid plate and cover of the support unit according to the embodiment of the present disclosure are assembled and fastened, and FIG. 5B is a cross-sectional view schematically illustrating a state in which the rigid plate and the cover are attached to and fixed to the display module.

First, directions on the drawings are defined. More specifically, a direction in which the image of the display panel 110 is implemented is defined as a front side, and an opposite side thereof is defined as a rear side. A front surface of the cover 220 of the support unit 200 of FIG. 2D refers to a direction heading the front side where the image of the display panel 110 is implemented and facing a rear surface of the display module 130, and a rear surface of the cover 220 refers to an opposite direction thereof.

As shown in the figures, the support unit 200 of FIG. 2D includes the bar-shaped rigid plate 210, the cover 220 covering the outside of the rigid plate 210, and the plurality of stiffeners 230 of FIG. 2D.

Here, the bar-shaped rigid plate 210 is a bistable reeled composite (BRC). When the rigid plate 210 is maintained in a flat state without a curvature in a width direction WD as shown in FIG. 3A, the rigid plate 210 is wound in a longitudinal direction LD. When the bar-shaped rigid plate 210 is maintained in a curved state with a curvature in the width direction WD, the bar-shaped rigid plate 210 has the rigidity in the longitudinal direction LD and is unwound and stretched in the longitudinal direction LD.

At this time, when the bar-shaped rigid plate 210 is maintained in the flat state without a curvature in the width direction WD, the bar-shaped rigid plate 210 is wound along the longitudinal direction LD such that a first surface 210*a* is disposed inside and a second surface 210*b* opposite to the first surface 210*a* is disposed outside, and when the bar-shaped rigid plate 210 is curved with a curvature in the width direction WD, the bar-shaped rigid plate 210 is bent with a curvature concave toward the first surface 210*a*.

Namely, the bar-shaped rigid plate 210 is made such that the direction of winding in the longitudinal direction LD and the direction of bending to have a curvature in the width direction WD are opposite to each other.

Therefore, the bar-shaped rigid plate 210 according to the embodiment of the present disclosure can be wound or unwound in the longitudinal direction LD without any additional fixing mechanism and can be maintained in the wound or unwound state with a certain rigidity.

As shown in FIG. 2D, the bar-shaped rigid plate 210 is disposed across the center portion of the back cover 120 along the rolling direction in which the display module 130 is rolled, more precisely, along the X-axis direction defined in the figure.

Accordingly, when the display module 130 is maintained in the rolled state, the rigid plate 210 has the flat state in the width direction WD, and as shown in FIG. 2A, the rigid plate 210 is wound around the outside of the display module 130. Thus, the display module 130 can stably maintain the rolled state.

Further, when the display module 130 is maintained in the unrolled state, as shown in FIG. 2D, the rigid plate 210 has the curved state with a curvature in the width direction WD so that the rigid plate 210 is unwound in the longitudinal direction LD. The rigid plate 210 supports the rear surface of the display module 130 in the unrolled state along the X-axis direction defined in the figures, thereby improving the rigidity of the display module 130 in the unrolled state.

Here, the rigidity of the rigid plate 210 in the longitudinal direction LD is related to a radius of the curvature of the rigid plate 210 which is curved in the width direction WD. For example, in order to obtain the required rigidity, the radius of the curvature of the rigid plate 210 curved in the width direction WD can be appropriately selected.

The rigid plate 210 may be formed by performing heat treatment to a metal plate such as stainless steel to thereby form a coil-shaped plate and passing the coil-shaped plate through a roller to thereby apply a curvature shape in the width direction.

The rigid plate 210 has a Vickers hardness of 200 to 220 Hv, an elongation of 30% or more in the width direction and the longitudinal direction, and a tensile strength of 5,000 to 10,000 kgf/cm$^2$.

At this time, the bar-shaped rigid plate 210 includes a plurality of holes 211 spaced apart from each other by a predetermined distance and having a first diameter.

The display module 130 in the unrolled state has the improved rigidity in the X-axis direction defined in the figures due to the rigid plate 210.

The cover 220 is disposed outside the bar-shaped rigid plate 210. The cover 220 is formed of a stretchable material including silicone resin, rubber, or an elastic resin. The cover 220 covers and protects the outside of the rigid plate 210 and, at the same time, fixes the position of the rigid plate 210 at the rear surface of the display module 130.

In more detail, the cover 220 includes a first cover surface 221, a second cover surface 223, and a third cover surface 225. The first cover surface 221 has a plate shape covering the outer surface of the rigid plate 210. The second cover surface 223 protrudes substantially vertically along an edge of the first cover surface 221. The third cover surface 225 is vertically bent outwardly from the second cover surface 223 so as not to face towards the first cover surface 221. The third cover surface 225 may be parallel to the first cover surface 221. The second cover surface 223 connects the first cover surface 221 and the third cover surface 225.

The third cover surface 225 is in close contact with and is attached to the rear surface of the display module 130, precisely, the rear surface of the back cover 120 through an adhesive material 229. Therefore, the first cover surface 221, the second cover surface 223 and the rear surface of the back cover 120 defines an inner storage space "A."

The bar-shaped rigid plate 210 is disposed in the inner storage space "A" defined by the first and second cover surfaces 221 and 223 of the cover 220 and the rear surface of the back cover 120.

Here, the cover 220 has a Shore hardness of 20 to 40 A, an elongation of 100 to 600% in the width direction and the longitudinal direction, and a tensile strength of 70 to 280 kgf/cm$^2$.

Accordingly, the cover 220 has very excellent elasticity. The cover 220 protects the rigid plate 210 and fixes the position of the rigid plate 210 at the rear surface of the display module 130 at the same time without restricting and limiting the free deformation of the display module 130.

The cover 220 and the rigid plate 210 are assembled and fastened with each other by inserting fixing protrusions 227 of the cover 220 into holes 211 of the rigid plate 210.

The fixing protrusions 227 are spaced apart from each other by a predetermined distance on the first cover surface 221 in correspondence with the holes 211 of the rigid plate 210. Each of the fixing protrusion 227 includes a first cylindrical protrusion 227a and a second cylindrical protrusion 227b. The first cylindrical protrusion 227a protrudes from the first cover surface 221 and has a second diameter and a first height. The second cylindrical protrusion 227b protrudes and extends outwardly from the first cylindrical protrusion 227a and has a third diameter and a second height. The third diameter is larger than the second diameter. The first height may be higher than the second height. At this time, the first cylindrical protrusion 227a is disposed between the first cover surface 221 and the second cylindrical protrusion 227b.

Here, the second diameter of the first cylindrical protrusion 227a is similar to (approximate to or substantially the same as) the first diameter of the hole 211 of the rigid plate 210, so that the first cylindrical protrusion 227a can pass through the hole 211 of the rigid plate 210. Since the third diameter of the second cylindrical protrusion 227b is larger than the first and second diameters of the hole and the first cylindrical protrusion 227a, the second cylindrical protrusion 227b can penetrate the hole 211 of the rigid plate 210 tightly.

Accordingly, as shown in FIG. 5A and FIG. 5B, the second cylindrical protrusion 227b penetrates the hole 211 of the rigid plate 210 tightly, and the first cylindrical protrusion 227a is inserted into the hole 211, so that the inner side of the second cylindrical protrusion 227b is in close contact with the surface of the rigid plate 210 and the rigid plate 210 is in close contact with and fixed to the inside of the first cover surface 221 in the inner storage space "A" of the cover 220.

As such, when the rigid plate 210 and the cover 220 are assembled and fastened, the outside of the third cover surface 225 of the cover 220 is in close contact with and attached to the rear surface of the display module 130, precisely, the rear surface of the back cover 120 through the adhesive material 229. Thus, the rigid plate 210 and the cover 220 are attached and fixed to the rear surface of the display module 130.

The rigid plate 210 and the cover 220 may use the characteristics of the rigid plate 210 such that the display module 130 can stably maintain the rolled state and can improve the rigidity of the display module 130 in the unrolled state.

In addition, the rigid plate 210 is wound around the outside of the display module 130 such that the display module 130 stably maintains the rolled state, and when the display module 130 is to be unrolled to implement the unrolled state, the rigid plate 210 is simply unwound together with the display module 130, thereby improving the rigidity of the display module 130 in the unrolled state through the simple operation.

Accordingly, the rollable display device 100 of FIG. 2A according to the embodiment of the present disclosure can facilitate the rolling and unrolling operations of the display module 130. Further, the display module 130 can be supported when unrolling, and can be stably fixed when rolling with the same support unit.

Here, the rigid plate 210 is in close contact with and attached to the first cover surface 221 of the cover 220, and the third cover surface 225 of the cover is attached and fixed to the display module 130. Thus, only the cover 220 is substantially attached and fixed to the display module 130.

As such, since only the cover 220 having high elasticity is attached and fixed to the display module 130, the rigid plate 210 for improving the rigidity of the display module 130 is not in direct contact with the display module 130.

As a result, it is possible to prevent the separation caused by the sliding of the display module 130 and the rigid plate 210.

In more detail, when the rollable display device 100 of FIG. 2D is in the rolled state, different stresses are generated inside and outside. The compressive stress acts on the inside of the rollable display device 100 of FIG. 2D in the rolled state, and the tensile stress acts on the outside of the rollable display device 100 of FIG. 2D in the rolled state.

Therefore, when the rigid plate 210 of the metal material is directly attached to the display module 130 through the adhesive material, there occurs the difference between the stress acting on the display module 130 and the stress acting on the rigid plate 210 of the metal material. The rigid plate 210, in which the tensile force is constrained to the display module 130 through the adhesive material, is slid from the rear surface of the display module 130 due to the difference in the stresses.

This eventually causes breakage of the adhesive material that attaches the rigid plate 210 to the display module 130, so that a part of the rigid plate 210 is separated from the display module 130. There is a case that the rigid plate 210 does not help to improve the rigidity of the display module 130.

Accordingly, in the rollable display device 100 of FIG. 2D according to the embodiment of the present disclosure, the rigid plate 210 is not directly attached to the display module 130, and the cover 220 is attached and fixed to the display module 130 after the rigid plate 210 is in close contact with and fixed to the cover 220 having the high elasticity, thereby minimizing or reducing the difference in the stresses applied to the display module 130 and the cover 220.

Namely, the stress applied to the rigid plate 210 is canceled by the tensile force of the rigid plate 210, which is not constrained, and the cover 220 attached and fixed to the display module 130 through the adhesive material 229 has relatively high elasticity such that the stress applied to the cover 220 can be canceled by the elasticity.

Therefore, the stress applied to the cover 220 is canceled, and the difference due to the stresses in different directions between the cover 220 and the display module 130 can be prevented.

As a result, it is possible to prevent the cover 220 from being slid from the display module 130, and it is also possible to prevent the rigid plate 210 from being separated from the display module 130. Accordingly, the rigidity of the display module 130 can be improved through the rigid plate 210.

At this time, preferably, the inner storage space "A" of the cover 220 where the rigid plate 210 is in close contact and fixed is formed such that a gap "G" of at least 2 to 5 mm is formed between the rigid plate 210 and the rear surface of the back cover 120. The gap "G" is to secure a space for forming a curvature so that the rigid plate 210 is curved to have the curvature in the width direction WD and has the rigidity in the longitudinal direction LD.

The plurality of stiffeners 230 of FIG. 2D may be disposed on the rear surface of the display module 130. Here, each of the plurality of stiffeners 230 of FIG. 2D has a bar shape having a length direction perpendicular to the rolling direction of the display module 130, and the plurality of stiffeners 230 of FIG. 2D are spaced apart from each other along the rolling direction and attached on the rear surface of the back cover 120 of the display module 130.

For example, the display module 130 is rolled in a length direction, more precisely the X-axis direction defined in FIG. 2D from its edge connected to the printed circuit board 118 of FIG. 1 and maintains the rolled state. At this time, the stiffeners 230 of FIG. 2D have a length direction of the Y-axis direction perpendicular to the X-axis direction defined in FIG. 2D, and the stiffeners 230 of FIG. 2D are spaced apart from each other along the X-axis direction and attached to the outside of the back cover 120 of the display module 130.

The stiffeners 230 of FIG. 2D are formed to have the length direction perpendicular to the rolling direction of the display module 130 and are spaced apart from each other with a predetermined distance therebetween and attached to the display module 130 along the rolling direction of the display module 130. Therefore, whiling securing the flexibility or elasticity of the display module 130 according to the rolling in the X-axis direction defined in FIG. 2D, the rigidity of the display module 130 is also more improved.

Namely, the stiffeners 230 of FIG. 2D improves the rigidity of the display module 130 in the Y-axis direction defined in the figure.

Accordingly, in the rollable display device 100 of FIG. 2D according to the embodiment of the present disclosure, the rigidity in the X-axis direction of FIG. 2D is improved by the bar-shaped rigid plate 210, and the rigidity in the Y-axis direction of FIG. 2D is improved by the stiffeners 230 of FIG. 2D. The rigidity can be improved in both the X-axis and Y-axis directions defined in FIG. 2D.

The stiffeners 230 of FIG. 2D may include a material which is light and has a relatively high strength. For example, the stiffeners 230 of FIG. 2D may be formed of at least one of metal such as aluminum, plastic and wood. However, the present disclosure is not limited thereto.

Here, the rollable display device 100 of FIG. 2D according to the embodiment of the present disclosure is illustrated in that the stiffeners 230 of FIG. 2D each have two parts separated from each other along two longitudinal edges of the display module 130 with respect to the cover 220 including the rigid plate 210. Alternatively, the stiffeners 230 of FIG. 2D may be formed across the rear surface of the display module 130 perpendicular to the length direction of the display module 130. At this time, the cover 220 including the rigid plate 210 of FIG. 2D may be disposed to overlap stiffeners 230, and it is desirable to position the rigid plate 210 and the cover 220 of FIG. 2D over the stiffeners 230, or to position the stiffeners 230 of FIG. 2D inside the cover 220 including the rigid plate 210.

As described above, the rollable display device 100 of FIG. 2D according to the embodiment of the present disclosure includes the rigid plate 210 formed of the bistable reeled composite (BRC), the cover for fixing the rigid plate 210 to the display module 130, and the support unit 200 of FIG. 2D including the plurality of stiffeners 230 of FIG. 2D at the rear surface of the display module 130, whereby the display module 130 stably maintains the rolled state, and when the display module 130 is in the unrolled state, the display module 130 is supported by the support unit 200 of FIG. 2D to thereby improve the rigidity.

In addition, the display module 130 in the rolled state can be supported or the rigidity of the display module 130 in the unrolled state can be improved through the simple operation that the support unit 200 of FIG. 2D is wound and unwound together with the display module 130. Thus, the rolling and unrolling operations of the display module 130 can be easily performed. Further, the rigid plate 210 is not directly fixed to the display module 130 and is fixed using the cover 220. As a result, the rigid plate 210 is prevented from being separated from the display module 130 due to the sliding phenomenon between the rigid plate 210 and the display module 130.

Meanwhile, it is shown and described that only one bar-shaped rigid plate 210 and one cover 220 are provided on the rear surface of the display module 130. Alternatively, a plurality of rigid plates and a plurality of covers may be provided on the rear surface of the display module 130 and may be spaced apart from each other.

It will be apparent to those skilled in the art that various modifications and variations can be made in the rollable display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A rollable display device, comprising:
a display module including a flexible display panel; and
a support unit disposed at a rear surface of the display module and including a bar-shaped rigid plate and a cover configured to fix the bar-shaped rigid plate to the rear surface of the display module,
wherein the bar-shaped rigid plate has a first hardness,
wherein the bar-shaped rigid plate is in close contact with and fixed to the cover having a second hardness lower than the first hardness, so that the bar-shaped rigid plate is free from the display module,
wherein the cover is attached and fixed to the rear surface of the display module through an adhesive material,
wherein a gap is formed between the bar-shaped rigid plate and the display module,
wherein the cover includes a first cover surface having a plate shape covering an outer surface of the bar-shaped rigid plate, a second cover surface protruding vertically along an edge of the first cover surface, and a third cover surface that vertically bends outwardly away from the second cover surface,
wherein the adhesive material is interposed between the third cover surface and the rear surface of the display module, and
wherein an inner storage space is defined by the first and second cover surfaces and the rear surface of the display module, and the bar-shaped rigid plate is disposed in the inner storage space.

2. The rollable display device of claim 1, wherein the bar-shaped rigid plate has a first elongation and the cover has a second elongation larger than the first elongation.

3. The rollable display device of claim 1, wherein the bar-shaped rigid plate has a first tensile strength and the cover has a second tensile strength lower than the first tensile strength.

4. The rollable display device of claim 1, wherein the bar-shaped rigid plate is formed of a metal material.

5. The rollable display device of claim 1, wherein the cover has a stretchable property and is formed of at least one of silicone resin, rubber and elastic resin.

6. The rollable display device of claim 1, wherein a plurality of holes having a first diameter is provided in the bar-shaped rigid plate, and a plurality of fixing protrusions are provided on the first cover surface and inserted in the plurality of holes, respectively.

7. The rollable display device of claim 6, wherein each of the plurality of fixing protrusions includes a first cylindrical protrusion having a second diameter similar to the first diameter and a second cylindrical protrusion protruding and extending outwardly from the first cylindrical protrusion to have a third diameter larger than the second diameter.

8. The rollable display device of claim 1, wherein the bar-shaped rigid plate has a longitudinal direction along a first direction in which the display module is rolled and unrolled, and
wherein the bar-shaped rigid plate is wound around an outside of the display module when the display module is rolled, and the bar-shaped rigid plate is unwound to support the rear surface of the display module when the display module is unrolled.

9. The rollable display device of claim 8, wherein the bar-shaped rigid plate is wound along the longitudinal direction such that a first surface is inward, and
wherein the bar-shaped rigid plate is unwound along the longitudinal direction when a second surface opposite to the first surface is curved with a curvature concave toward the first surface in a width direction.

10. The rollable display device of claim 8, wherein the support unit includes a plurality of stiffeners, and
wherein the plurality of stiffeners have a length direction corresponding to a second direction perpendicular to the first direction and are spaced apart from each other with a predetermined distance therebetween on the rear surface of the display module along the first direction.

11. The rollable display device of claim 10, wherein each of the plurality of stiffeners has two parts separated from each other along two longitudinal edges of the display module with respect to the bar-shaped rigid plate and the cover.

12. The rollable display device of claim 10, wherein the bar-shaped rigid plate and the cover are disposed over the plurality of stiffeners.

13. The rollable display device of claim 1, wherein a printed circuit board is provided at an edge of the display panel, and the printed circuit board is disposed inside the display panel when the display module is rolled.

14. The rollable display device of claim 13, wherein an outside of the printed circuit board is surrounded by a case.

15. The rollable display device of claim 1, wherein the display module further includes a back cover at a rear surface of the display panel.

16. A rollable display device, comprising:
a display module including a flexible display panel; and
a support unit disposed at a rear surface of the display module and including a cover attached and fixed to the display module and a bar-shaped rigid plate in close contact with and fixed to the cover,
wherein the bar-shaped rigid plate has a first hardness, and the cover has a second hardness lower than the first hardness,
wherein the cover is attached and fixed to the rear surface of the display module through an adhesive material, wherein a gap is formed between the bar-shaped rigid plate and the display module, wherein the cover includes a first cover surface having a plate shape covering an outer surface of the bar-shaped rigid plate, a second cover surface protruding vertically along an edge of the first cover surface, and a third cover surface that vertically bends outwardly away from the second cover surface, wherein the adhesive material is interposed between the third cover surface and the rear surface of the display module, and wherein an inner storage space is defined by the first and second cover surfaces and the rear surface of the display module, and the bar-shaped rigid plate is disposed in the inner storage space.

17. A rollable display device, comprising:

a display module including a flexible display panel; and a support unit disposed at a rear surface of the display module and including a rigid plate which is attached to the display module via a flexible connecting element, wherein the flexible connecting element is attached and fixed to the rear surface of the display module through an adhesive material, wherein a gap is formed between the rigid plate and the display module, wherein the flexible connecting element includes a first cover surface having a plate shape covering an outer surface of the rigid plate, a second cover surface protruding vertically along an edge of the first cover surface, and a third cover surface that vertically bends outwardly away from the second cover surface, wherein the adhesive material is interposed between the third cover surface and the rear surface of the display module, and wherein an inner storage space is defined by the first and second cover surfaces and the rear surface of the display module, and the rigid plate is disposed in the inner storage space.

18. The rollable display device of claim 17, wherein the flexible connecting element includes a cover, wherein the cover is attached to the display module and the rigid plate is attached to the cover.

* * * * *